United States Patent
Tian et al.

(10) Patent No.: US 11,439,043 B2
(45) Date of Patent: Sep. 6, 2022

(54) MULTI-DEVICE COOLING STRUCTURE HAVING ASSEMBLY ALIGNMENT FEATURES

(71) Applicant: International Business Machines Corporation, Armonk, NY (US)

(72) Inventors: Shurong Tian, Mount Kisco, NY (US); Todd E. Takken, Brewster, NY (US); Liam McAuliffe, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 16/416,991

(22) Filed: May 20, 2019

(65) Prior Publication Data

US 2020/0375066 A1 Nov. 26, 2020

(51) Int. Cl.
*H05K 7/20* (2006.01)

(52) U.S. Cl.
CPC ..... *H05K 7/20509* (2013.01); *H05K 7/20009* (2013.01); *H05K 7/20254* (2013.01); *H05K 7/20409* (2013.01)

(58) Field of Classification Search
CPC ............. H05K 7/20509; H05K 7/209; H05K 7/20927; H05K 7/20154; H05K 7/20636; H05K 7/20676
See application file for complete search history.

(56) References Cited

U.S. PATENT DOCUMENTS

| | | | |
|---|---|---|---|
| 5,373,418 A * | 12/1994 | Hayasi | H01L 23/3675 361/707 |
| 5,463,529 A | 10/1995 | Chia et al. | |
| 6,219,248 B1 | 4/2001 | Werner et al. | |
| 6,760,224 B2 | 7/2004 | Moden et al. | |
| 7,119,433 B2 | 10/2006 | Corbin, Jr. et al. | |
| 7,151,669 B2 * | 12/2006 | Liu | H01L 23/3675 361/707 |
| 7,310,233 B2 * | 12/2007 | Bell | H05K 7/20509 165/185 |
| 7,397,664 B2 | 7/2008 | Ankireddi | |
| 8,385,069 B2 * | 2/2013 | Iyengar | G06F 1/20 165/80.4 |
| 9,042,100 B2 | 5/2015 | Kang | |
| 9,119,327 B2 * | 8/2015 | Albrecht, III | H05K 1/0203 |
| 9,980,363 B2 | 5/2018 | Kim et al. | |
| 10,160,072 B2 | 12/2018 | Boday et al. | |
| 2005/0036292 A1 | 2/2005 | Chengalva et al. | |
| 2009/0190304 A1 * | 7/2009 | Meyer, IV | G06F 1/20 361/679.47 |
| 2016/0157334 A1 | 6/2016 | Koukami et al. | |
| 2018/0145604 A1 * | 5/2018 | Kadota | H01L 23/3672 |
| 2019/0139862 A1 * | 5/2019 | Chang | H01L 23/3675 |

* cited by examiner

*Primary Examiner* — Mukundbhai G Patel
(74) *Attorney, Agent, or Firm* — Scully, Scott, Murphy & Presser, P.C.; Daniel P. Morris, Esq.

(57) ABSTRACT

A single device having both thermal and alignment features is provided to mechanically align and more efficiently cool multiple heat generating components. The device includes one or more thermal structures and assembly alignment features, in which the one or more thermal structures make thermal contact with a plurality of heat generating components. The assembly alignment features control the positions of the heat generating components during assembly of the heat generating components onto a common substrate.

10 Claims, 8 Drawing Sheets

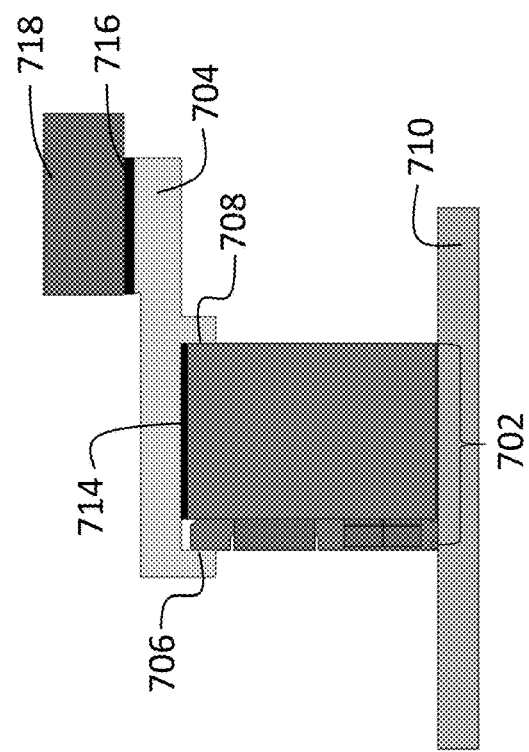
FIG. 7
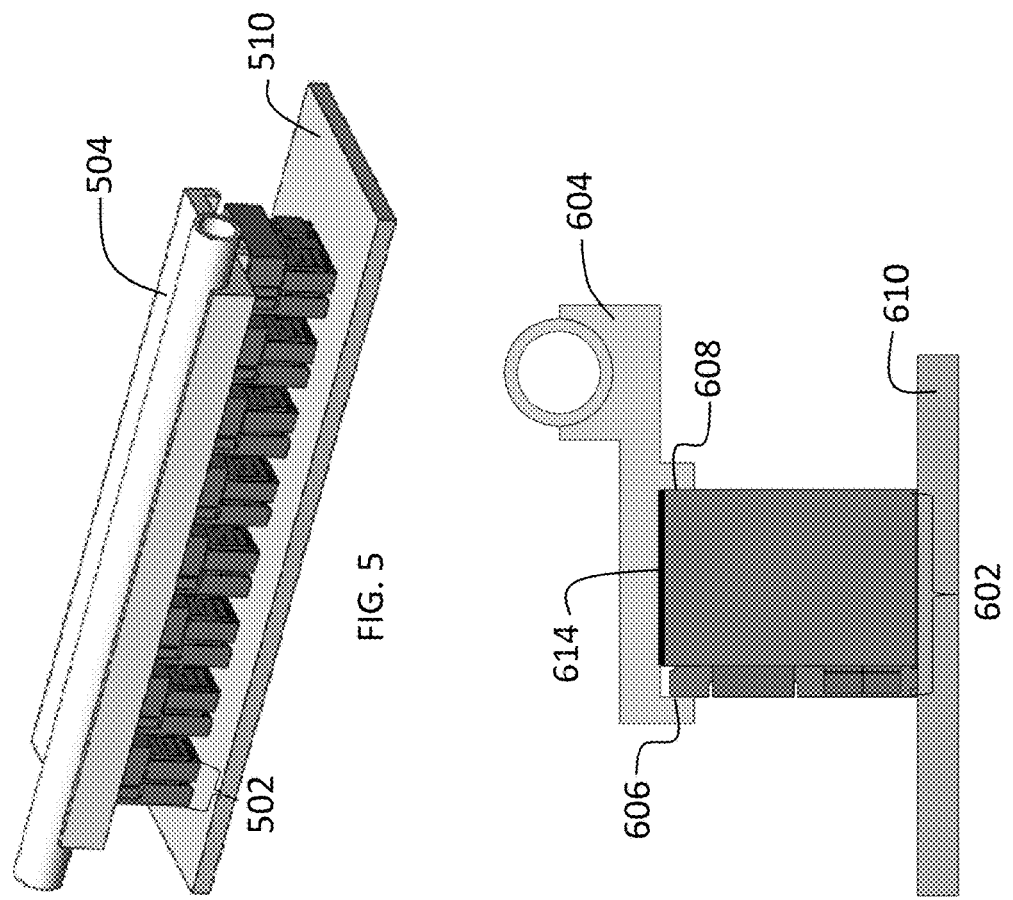
FIG. 5
FIG. 6

MULTI-DEVICE COOLING STRUCTURE HAVING ASSEMBLY ALIGNMENT FEATURES

STATEMENT REGARDING FEDERALLY SPONSORED RESEARCH OR DEVELOPMENT

This invention was made with Government support under the Contract No.: DE-AC52-07NA27344 awarded by the Department of Energy. The Government has certain rights in this invention.

BACKGROUND

The present application relates to air-cooled heat sinks, water-cooled cold plates, assembly of printed circuit boards and component alignment during assembly. More particularly, the present application relates to a single device having both thermal and alignment features to mechanically align and more efficiently cool multiple heat generating components.

Computing systems use not only higher power devices such as, for example, process chips (CPUs) and graphic chips (GPUs), but also include many relatively lower power components such as, for example, DC-DC power supplies. Depending on the data center environment and requirements, computing systems can be air cooled or liquid cooled. In either cooling approach, many components need contact with the cooling device to meet their thermal requirements. Commonly, each heat generating component uses a separate heat sink or cooling structure.

Low weight, high pin count components may be able to self-align during the solder reflow assembly process; however, high weight, low pin count components may need additional alignment features.

SUMMARY

A single device having both thermal and alignment features is provided to mechanically align and more efficiently cool multiple heat generating components. In one embodiment, the device includes one or more thermal structures and assembly alignment features, in which the one or more thermal structures make thermal contact with a plurality of heat generating components. The assembly alignment features control the positions of the heat generating components during assembly of the heat generating components onto a common substrate.

BRIEF DESCRIPTION OF THE DRAWINGS

FIG. 5 is a 3D overall view illustrating a liquid cooled heat removal device in accordance with the present application that provides alignment for multiple heat generating components.

FIG. 6 is a cross-sectional side view illustrating a heat removal device (liquid-cooled cold plate) in accordance with the present application in which each straight edge provides alignment to a single heat generation component.

FIG. 7 is a cross-sectional side view illustrating a heat removal device (liquid-cooled heat spreader) in accordance with the present application in which each straight edge provides alignment to a single heat generation component.

DETAILED DESCRIPTION

Figure 1:
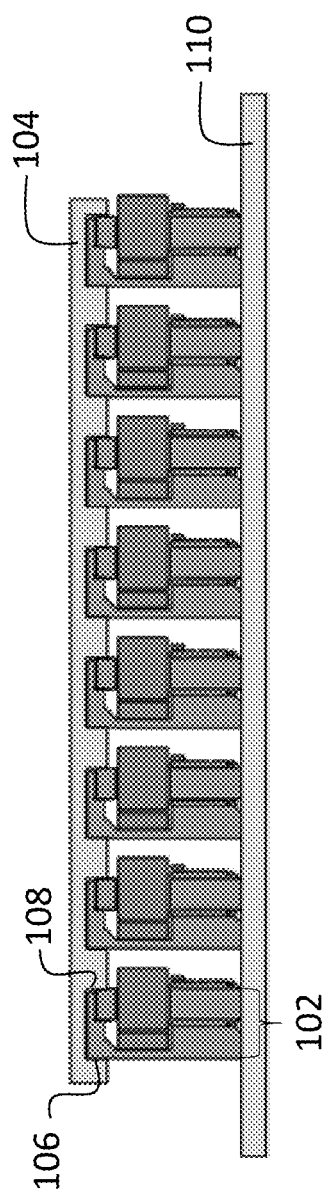
FIG. 1 is a cross-sectional side view illustrating a thermal heat spreading device that provides alignment for multiple heat generating components in accordance with the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, a single device having both thermal and alignment features is provided in the present application to mechanically align and more efficiently cool multiple heat generating components. The device is formed by cost-efficient aluminum extrusion or other metal forming manufacturing processes including, but not limited to, machining or molding.

In some embodiments, the one or more thermal structures interface with, and transfer heat, into an air-cooled heat sink. In one example, a single heat spreader with alignment features constitutes the base of the device, with air-cooling fins on top providing heat removal. The air-cooling fins can be formed from aluminum or bent, thin copper sheet metal.

In another embodiment, a single heat spreader with alignment features constitutes the base of the device, with an integrated water-cooled cold plate providing heat removal.

Using the device of the present application can provide substantial benefits. For example, using one common heat sink instead of multiple individual smaller heat sinks provides cost reduction, thermal benefit and needed alignment.

The device of the present application including a heat sink or heat spreader with alignment features has not only thermal benefits, but also mechanical alignment benefits. The current available (i.e., prior art) air-cooled heat sink or water-cooled cold plate or heat spreader do not have alignment features. Using the current available heat sink, cold plate or heat spreader, a separate alignment structure to align the multiple devices during the solder reflow process is required. The device of the present application can significantly reduce the assembly process cost and the parts manufacturing cost.

Notably, and as depicted in the various embodiments illustrated in the drawings of the present application, the present application provides a device that includes one or more thermal structures and assembly alignment features in which the one or more thermal structures make thermal contact with a plurality of heat generating components. Thermal contact means having a relatively low thermal resistance between two bodies. If there is a temperature difference between two bodies which are in thermal contact, then heat will flow from the hotter body to the cooler body. In this particular case, the thermal structures have a relatively low resistance thermal path connecting these thermal structures to the heat generating components.

The assembly alignment features which may include one or more straight edges (or surfaces) can control the positions of the heat generating components during assembly of the heat generating components onto a common substrate such as, for example, a mother board or a printed circuit board.

In one embodiment, the one or more thermal structures that can be employed in the device of the present application permit the spreading of heat between the one or more heat generating components. One example of such a thermal structure that permits heat spreading is a thermal spreader.

In another embodiment, the one or more thermal structures that can be employed in the device of the present application facilitate the evacuation of heat from the heat generating components. One example of such a thermal structure that facilitates such heat evacuation is a heat sink such as, for example, an air-cooled heat sink, or a liquid-cooled cold plate.

The heating generating component that can be employed in the present application includes any element that generates heat during use.

In one embodiment of the present application, the one or more thermal structures and the assembly alignment features are formed together from a common piece of material. That is, the one or more thermal structures and the assembly alignment features are composed of a single material of unitary construction.

In another embodiment of the present application, the one or more thermal structures and the assembly alignment features are first formed separately and subsequently joined. That is, the one or more thermal structures and assembly alignment features are separate, but joined, components. Joining of the thermal structures and the assembly alignment features may include soldering, or adhering with a clue or other adhesive.

Reference is now made to FIG. 1 which illustrates a thermal heat spreading device 104 that provides alignment for multiple heat generating components 102. The assembled device shown in FIG. 1 includes the thermal heat spreading device 104, multiple heat generating components 102 and control surfaces 106 and 108; the controlled surfaces 106, 108 serve as assembly alignment features. Before the multiple heat generating components 102 are soldered on a common mother board or substrate 110, the multiple heat generating components 102 are aligned at the control surfaces 106 and 108 that located on a surface of the thermal heat spreading device 104. These surfaces 106, 108 control the positions of the heat generating components 102 during the assembly of the heat generating devices 102 onto the common substrate 110.

Figure 2:
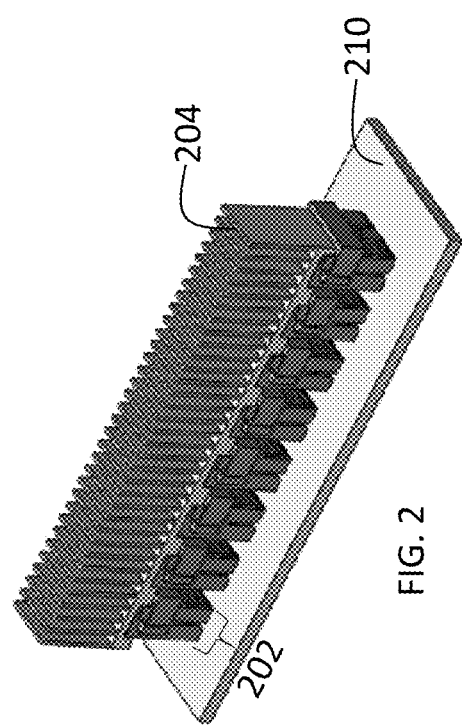
FIG. 2 is a three-dimensional (3D) overall view illustrating an air-cooled heat removal device in accordance with the present application that provides alignment for multiple heat generating components.

Reference is now made to FIG. 2 which illustrates an air-cooled heat removal device 204 that provides alignment for multiple heating generating components 202. The assembled device shown in FIG. 2 includes multiple heat generating components 202, the heat removal device 204 and a common mother board or substrate 210.

Figure 3:
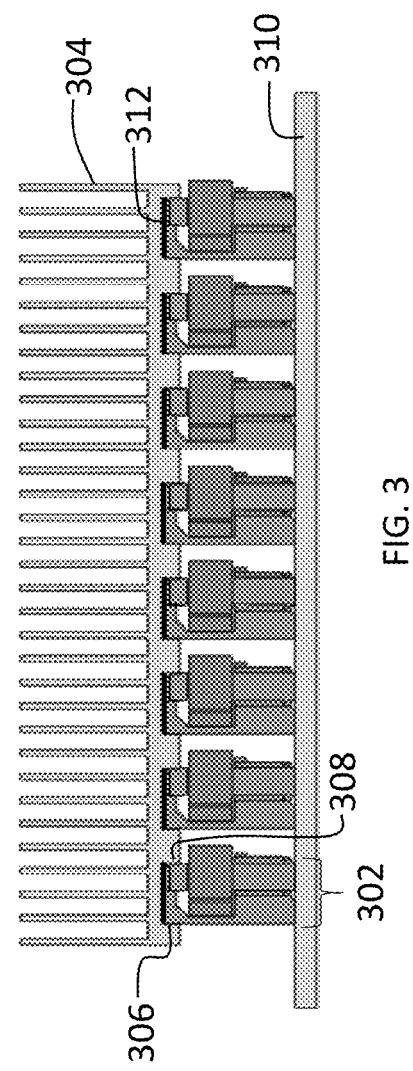
FIG. 3 a cross-sectional side view illustrating a heat removal device in which each straight edge provides alignment to a single heat generation component in accordance with an embodiment of the present application.

Reference is now made to FIG. 3 which illustrates a heat removal device 304 in which each straight edge 306 or 308 provides alignment to a single heat generation component 302. A straight edge is a variation in height of the surface of the heat removal device, wherein this variation delineates the heat removal device's surface into a lower height region and a higher height region, and wherein the line separating these two regions is straight. Although many patterns of height variation could be used, straight edges 306 or 308 may be the most cost effective way to provide alignment. The heat removal device 304 includes control surfaces 306 and 308; the controlled surfaces 306, 308 serve as assembly alignment features. The control surfaces 306 and 308 provide an alignment structure for the multiple heat generating components 302. The multiple heat generating components 302 can be either be soldered or glued through a thermally conductive glue 312. Any common solder may be used in the present application.

Figure 4B:
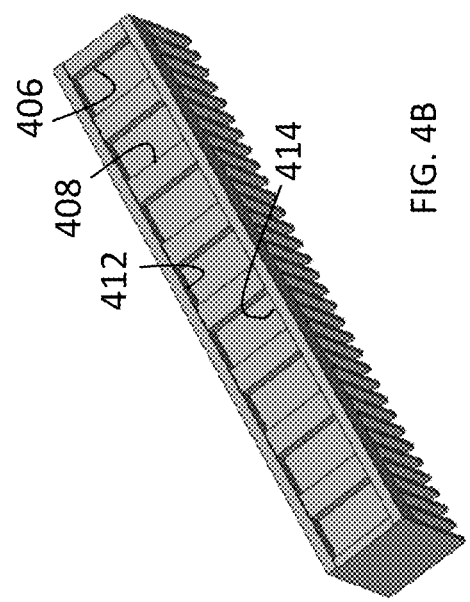
FIG. 4B is an overall view illustrating a heat sink with alignment features for multiple heat generating components in accordance another embodiment of the present application.
Figure 4A:
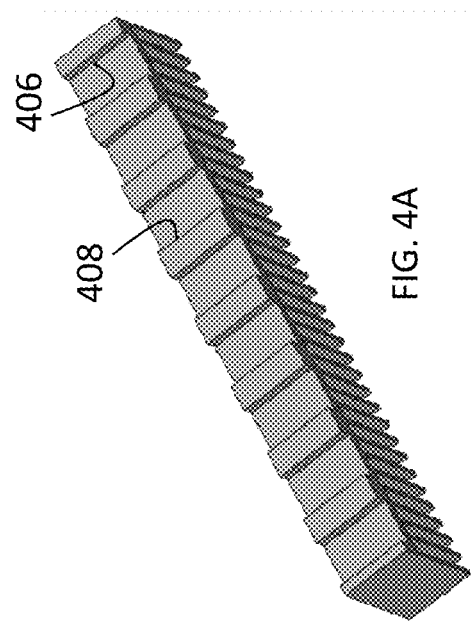
FIG. 4A is an overall view illustrating a heat sink with alignment features for multiple heat generating components in accordance an embodiment of the present application.

Referring now to FIGS. 4A and 4B, there are illustrated a heat sink with alignment features for multiple heat generating components in accordance with various embodiments of the present application. The heat sink with the alignment features shown in FIG. 4A includes two control surfaces 406 and 408, while the heat sink with alignment features shown in FIG. 4B includes four control surfaces 406, 408, 412, 414. The control surfaces serve as assembly alignment features.

Reference is now made to FIG. 5 which illustrates a liquid-cooled heat removal device 504 that provides alignment for multiple heat generating components 502. The assembled device shown in FIG. 4 includes a liquid-cooled cold plate with assembly alignment feature 504, multiple heat generating components 502, and a common mother board or substrate 510.

Referring now to FIG. 6, there is illustrated a heat removal device (liquid-cooled cold plate) in which height variation on the surface of the heat removal device is provided in the form of straight edges 606 and 608, wherein each straight edge (provides alignment to a single heat generation component 602. The heat generating component 602 will be aligned, soldered or glued through a thermally conductive glue 614 onto the backside of the liquid-cooled cold plate 604. Any common solder may be used in the present application.

Reference is now made to FIG. 7 which illustrates a heat removal device (heat spreader) 704 in which height variation on the surface of the heat removal device is provided in the form of straight edges 706 and 708, wherein each straight edge provides alignment to a single heat generation component 702. The assembled device includes multiple heat generating components 702, the heat spreader 704, a solder or thermal conductive glue 714, a solder or thermal conductive glue 716 and a cold plate 718. The multiple heat generating components 702 will be aligned on control surfaces 706, 708 then soldered or glued through a thermally conductive glue 714 onto the backside of the heat spreader 704. The assembled device will then go through a solder reflow process to solder the assembled device onto the common mother board or substrate 710. Solder reflow is a process in which a solder paste (typically a mixture of powdered solder and a flux) is used to temporality attach one component to another, after which the entire assembly is subjected to a controlled heating process which melts the solder and permanently connects the two components together via a solder joint.

Figure 8B:
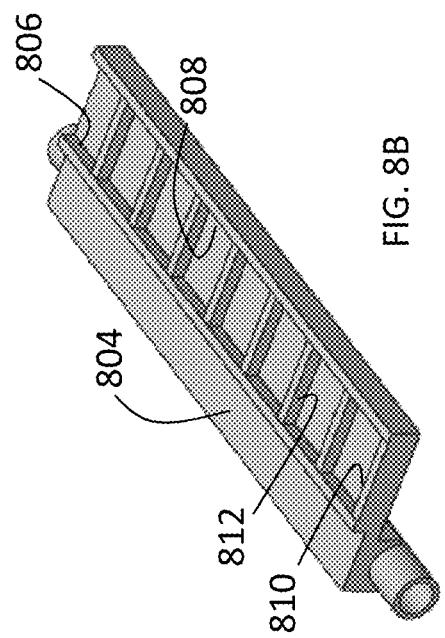
FIG. 8B is an overall view illustrating a liquid-cooled cold plate with alignment features for multiple heat generating components in accordance with another embodiment of the present application.
Figure 8A:
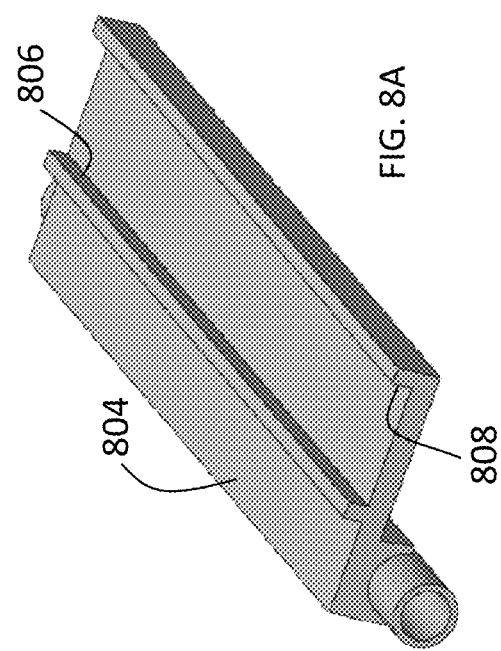
FIG. 8A is an overall view illustrating a liquid-cooled cold plate with alignment features for multiple heat generating components in accordance with an embodiment of the present application.

Referring now to FIGS. 8A and 8B, there are illustrated a liquid-cooled cold plate with assembly alignment features 804 for multiple components in accordance with various embodiments of the present application. The liquid-cooled cold plate with assembly alignment feature 804 shown in FIG. 8A includes two control surfaces 806 and 808, while the heat sink with assembly alignment feature 804 shown in FIG. 8B includes four control surfaces 806, 808, 812, 814.

Figure 9B:
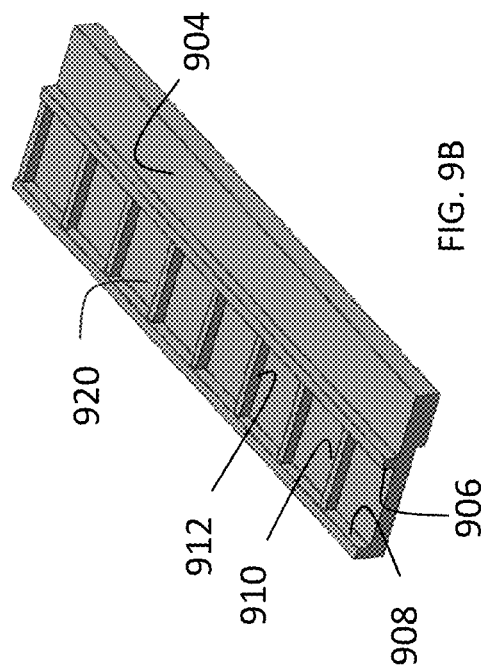
FIG. 9B is an overall view illustrating a liquid-cooled heat spreader with alignment features for multiple heat generating components in accordance with another embodiment of the present application.
Figure 9A:
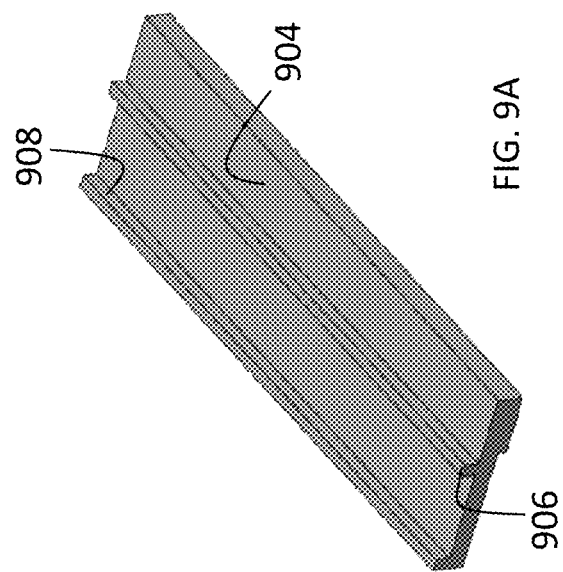
FIG. 9A is an overall view illustrating a liquid-cooled heat spreader with alignment features for multiple heat generating components in accordance with an embodiment of the present application.

Referring now to FIGS. 9A and 9B, there are illustrated a liquid-cooled heat spreader with alignment features 904 for multiple components in accordance with various embodiments of the present application. The liquid-cooled heat spreader with assembly alignment feature 904 shown in FIG. 9A includes two control surfaces 906 and 908, while the heat sink with assembly alignment features 904 shown in FIG. 9B includes four control surfaces 906, 908, 912, 914.

Figure 10B:
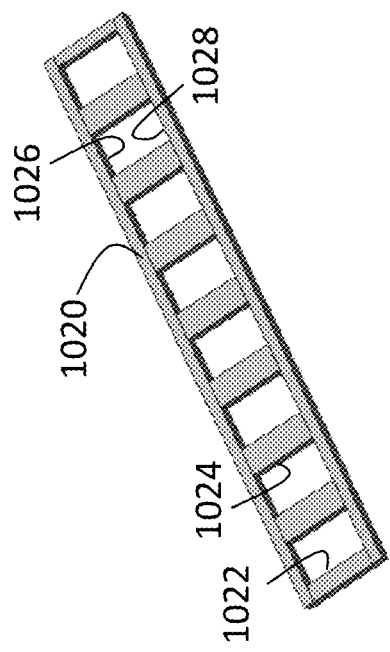
FIG. 10B is an overall view depicting the alignment structure device used in the assembled device depicted in FIG. 10A.
Figure 10A:
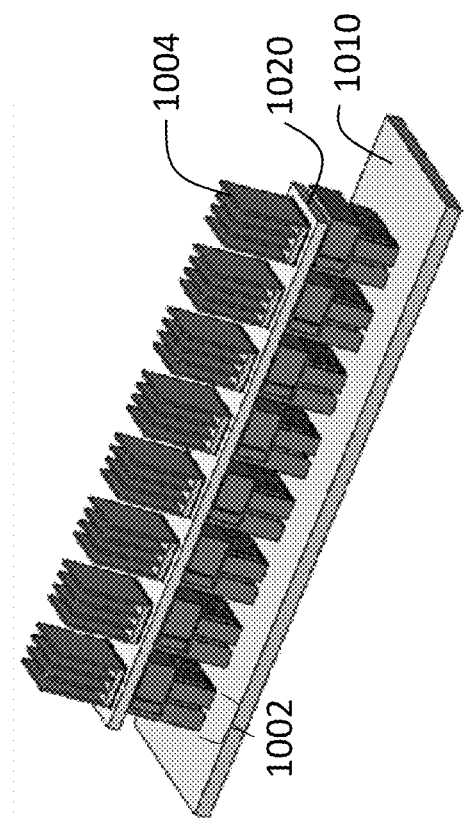
FIG. 10A is a 3D overall view illustrating initially separate alignment and thermal structures which are joined into one device to provide alignment for multiple heat generating components and heat removal in an air-cooling environment and in accordance with an embodiment of the present application.

Reference is now made to FIG. 10A which illustrates a structure device that provides alignment for multiple heat generating components 1002 in an air cooling environment. The assembled device of FIG. 10A includes the multiple heat generating components 1002, an assembly alignment structure 1020, a plurality of individual heat sinks 1004, and a common mother board or substrate 1010. The assembly alignment structure 1020 of FIG. 10A includes four control surfaces 1022, 1024, 1026, 1028 as is clearly shown in FIG. 10B. The assembly alignment structure 1020 can be composed of a plastic or a metal. The multiple heat generating devices 1002 will be aligned using the assembly alignment structure 1020 through the control surfaces 1022, 1024, 1026, 1028.

Figure 11:
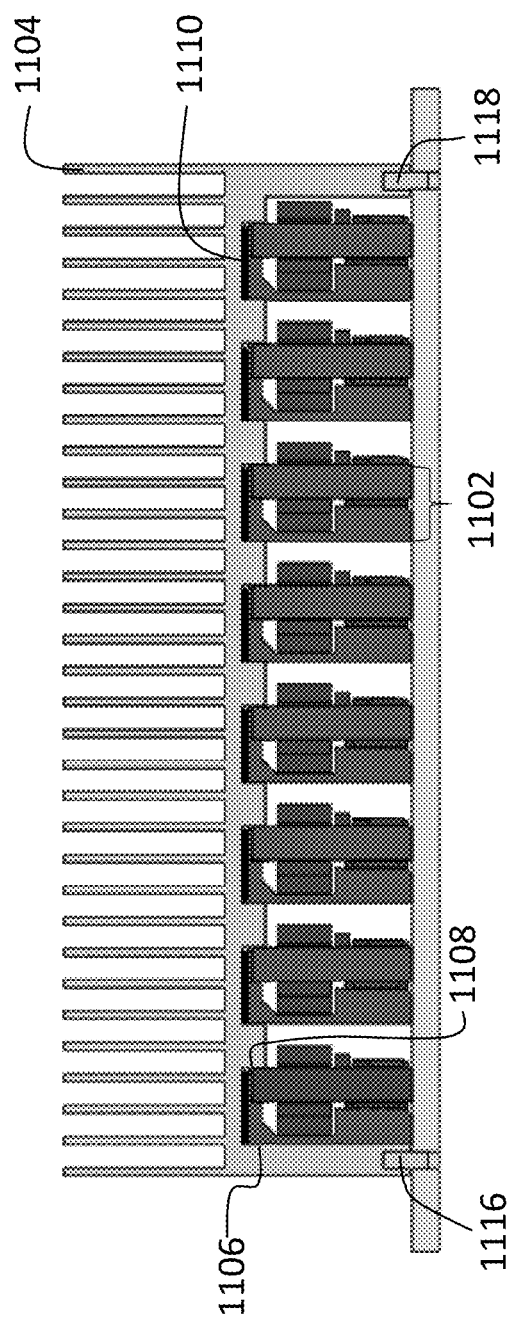
FIG. 11 is a 3D overall view illustrating location pins on a common substrate that provides rotation limitations of a heat removal device with alignment for multiple heat generating components during solder reflow process and in accordance with an embodiment of the present application.

Reference is lastly made to FIG. 11 which illustrates location pins 1116, 1118 on a common substrate 1110 that avoid rotation of a heat removal device with alignment for multiple heat generating components 1102 during solder reflow process. The assembled device shown in FIG. 11 includes s multiple heat generating devices 1102, the heat sink with alignment feature 1104, location pins 1116, 1118, and a common mother board or substrate 1110.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A device comprising one or more thermal structures comprising a liquid cooled cold plate containing assembly alignment features located along a bottom surface of the liquid cooled cold plate and a grooved area traversing an entire length of a top surface, which is opposite the bottom surface, of the liquid cooled cold plate, wherein the one or more thermal structures make thermal contact with a plurality of heat generating components, and wherein the assembly alignment features provide height variation, and alignment surfaces, along the bottom surface of the one or more thermal control structures, the alignment surfaces are configured to control the position of each of the heat generating components between the alignment surfaces during assembly of the heat generating components onto a common substrate, and wherein each alignment feature provides alignment for a single heating generating component of the plurality of heat generating components in the alignment area, and wherein a sidewall of the single heat generating component is in direct physical contact with one of the alignment surfaces in the alignment area.

2. The device of claim 1, wherein the one or more thermal structures permit the spreading of heat between the plurality of heat generating components.

3. The device of claim 1, wherein the one or more thermal structures facilitate the evacuation of heat from the plurality of heat generating components.

4. The device of claim 1, wherein the alignment surfaces comprise one or more straight edges.

5. The device of claim 1, wherein the one or more thermal structures and assembly alignment features are composed of a single material of unitary construction.

6. The device of claim 1, wherein the one or more thermal structures and assembly alignment features are separate, but joined, components.

7. The device of claim 1, wherein the common substrate is a printed circuit board.

8. The device of claim 7, wherein the assembly comprises solder reflow.

9. The device of claim 1, wherein the assembly alignment features maintain relative positions and orientations between one of the heat generating components and another of the heat generator components.

10. The device of claim 1, wherein the assembly alignment features maintain relative positions and orientations between one or more of the heat generating components and the substrate.

\* \* \* \* \*